(12) United States Patent
Kao

(10) Patent No.: US 7,060,550 B2
(45) Date of Patent: Jun. 13, 2006

(54) METHOD OF FABRICATING A BIPOLAR JUNCTION TRANSISTOR

(75) Inventor: Ching-Hung Kao, Hsin-Chu Hsien (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 10/904,150

(22) Filed: Oct. 26, 2004

(65) Prior Publication Data

US 2006/0099757 A1   May 11, 2006

(51) Int. Cl.
*H01L 21/8238* (2006.01)
(52) U.S. Cl. .................... 438/202; 438/234
(58) Field of Classification Search .......... 438/170, 438/189, 202–208, 234–239, 309
See application file for complete search history.

(56) References Cited

U.S. PATENT DOCUMENTS 5,061,646 A * 10/1991 Sivan et al. ............ 438/363

\* cited by examiner

*Primary Examiner*—David Nelms
*Assistant Examiner*—Quoc Hoang
(74) *Attorney, Agent, or Firm*—Winston Hsu

(57) ABSTRACT

A method for fabricating a bipolar junction transistor on a wafer is disclosed. The wafer has a N-type doped area and a plurality of isolated structures. A protection layer is formed on the wafer and portions of the protection layer are then removed to expose portions of the doped area. A P-type epitaxy layer is formed on the protection layer and the first doped area and then portions of the epitaxy layer and the protection layer are removed. An insulation layer is formed and at least a collector opening and emitter opening are formed within the insulation layer. Following that, a polysilicon layer is formed to fill the collector opening and the emitter opening. A spacer is formed beside the polysilicon layer and the epitaxy layer followed by performing a self-aligned silicidation process to form a salicide layer on the polysilicon layer and portions of the epitaxy layer.

13 Claims, 12 Drawing Sheets

METHOD OF FABRICATING A BIPOLAR JUNCTION TRANSISTOR

BACKGROUND OF INVENTION

1. Field of the Invention

The invention relates to a fabrication method of a bipolar junction transistor (BJT), and more particularly, to a fabrication method which can effectively reduce the manufacture procedure of a bipolar complementary metal oxide semiconductor (BiCMOS) transistor.

2. Description of the Prior Art

A bipolar junction transistor (BJT) is one of the most important semiconductor devices in modern times. The BJT is a three-terminal device that comprises two inseparable PN junctions. The terminals are called emitter, base, and collector. The BJT device conducts current with electrons and holes simultaneously and has the advantages of high speed and large current allowance in a small device, making the BiCMOS structure comprised of the BJT and CMOS devices popularly used to enhance operational speed. However, the conventional manufacturing procedure of the BiCMOS uses many photo processes to combine the standard BJT and CMOS devices, causing the manufacturing procedure to be very complicated.

Please refer to FIG. 1, which is a cross-sectional diagram of a NPN type BJT on a semiconductor wafer 100 according to the prior art. As FIG. 1 shows, a P type first doping region 104, an N type second doping region 106, and a plurality of isolated structures 108 are formed on a substrate 102. The second doping region 106 is used for defining position of the collector electrode of the BJT, and the isolated structures 108 define at least one predetermined region on the surface of the second doping region 106 for a base electrode region of the BJT. Next, an ion implantation process is performed to form a P type third doping region 110 in the second doping region 106 to form the base electrode of the BJT. A shielding layer 112 is then formed on the surface of the semiconductor wafer 100 to protect the CMOS transistor or other elements on the semiconductor wafer 100. An opening can be formed within the shielding layer 112, an N type doping layer 114 can be formed on the third doping region 110, and portions of the shielding layer 112 are removed. The doping layer 114 is used for the emitter electrode of the BJT, and can be made from epitaxy, amorphous silicon, or polysilicon. For reducing the resistance of the doping layer 114, the doping layer 114 can further include an N type heavy doping. Then, a spacer 116 is formed on the sidewall of the doping layer 114, and a self-aligned silicidation (salicide) process is utilized to form a silicide layer 118 on surfaces of the first doping region 104, the second doping region 106, the third doping region 110 and the doping layer 114. The silicide layer functions as contact regions of the BJT device.

The conventional BiCMOS has a high operational speed, but the manufacturing procedure is too complicated to lower the manufacturing cost. For the cost benefit, many factory owners would rather use other low-speed devices than use the high-speed BiCMOS device.

SUMMARY OF INVENTION

It is therefore a primary objective of the claimed invention to provide a method for simplifying the manufacturing procedure of the BJT to solve the above-mentioned problem.

According to the claimed invention, the method for fabricating a BJT firstly provides a semiconductor wafer including a doping region of a first conductivity type and a plurality of isolated structures positioned on both ends of the doping region. Next, a protection layer is formed on the semiconductor wafer, and portions of the protection layer are removed to expose portions of the doping region. A doping layer of a second conductivity type is formed on the protection layer and the exposed doping region, and portions of the doping layer and portions of the protection layer are removed to define a base electrode region. Then, an isolation layer is deposited on the semiconductor wafer, and portions of the isolation layer are removed to form at least a collector electrode opening and at least an emitter electrode opening. A polysilicon layer is formed in the collector electrode opening and the emitter electrode opening. The isolation layer is removed, and a spacer structure is formed at a side wall of the polysilicon layer and the doping layer. Finally, a self-aligned silicidation process is performed to form a silicide layer on surfaces of the polysilicon layer and portions of the doping layer to be a contact region of the bipolar junction transistor.

It is an advantage of the claimed invention that the method for fabricating the BiCMOS can omit the steps of zero layer mark definition, buried layer implant/drive-in, substrate epitaxy deposition, and collector implant/drive-in, so that the manufacturing cost can be effectively reduced. The claimed invention can help the industry take advantages of the BiCMOS.

These and other objectives of the claimed invention will no doubt become obvious to those of ordinary skill in the art after reading the following detailed description of the preferred embodiment that is illustrated in the various figures and drawings.

DETAILED DESCRIPTION

Figure 1:
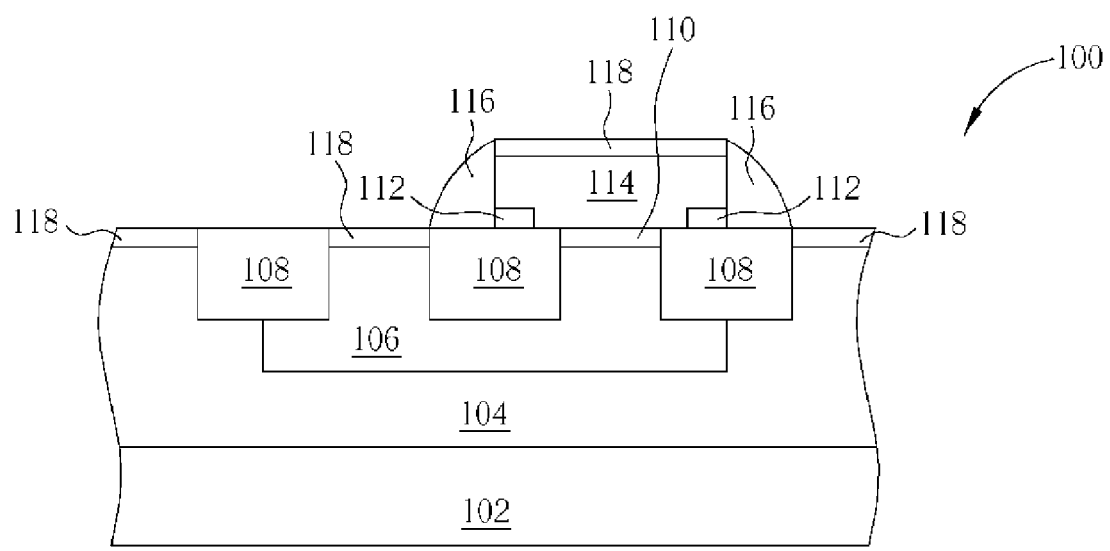
FIG. 1 is a cross-sectional diagram of a BJT according to the prior art.
Figure 2:
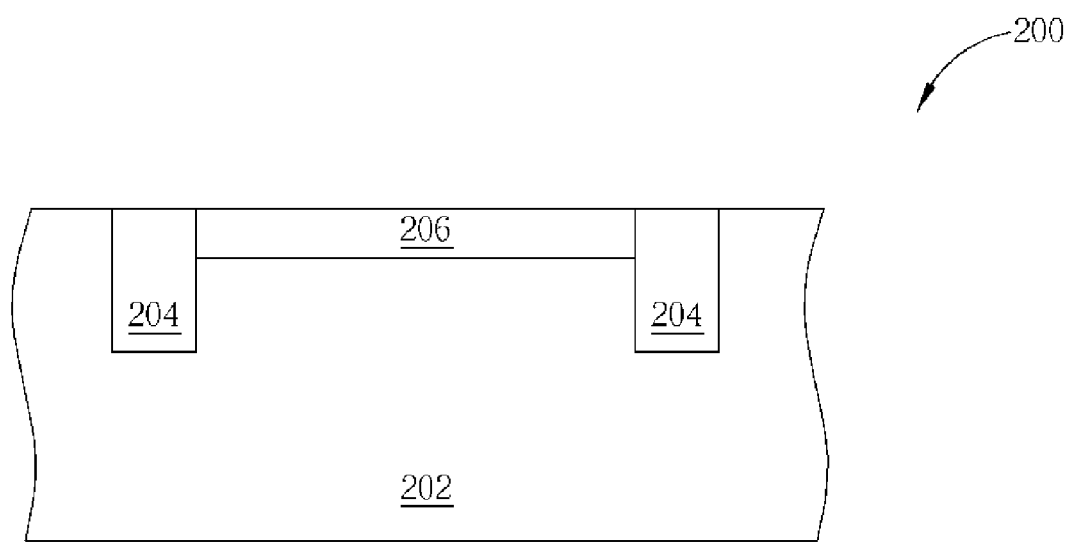
FIGS. 2–11 are schematic diagrams of the fabrication method of a BJT according to a the present invention.

Please refer to FIGS. 2–11, which are schematic diagrams showing the fabrication method of a BJT according to a first preferred embodiment of the present invention. As shown in FIG. 2, a substrate 202 of a semiconductor wafer 200 has a doping region 206 of a first conductivity type and a plurality of isolated structures 204 positioned on both ends of the doping region 206. The isolated structures 204 are formed by shallow trench isolation (STI) or local oxidation of silicon (LOCOS), and the doping region 206 can be simultaneously formed with other doping regions on the semiconductor wafer 200. For example, the doping region 206 can be simultaneously formed with at least one source/drain region of a CMOS in a same implant process. Of course, the doping region 206 can be also formed in an independent implant process.

Figure 3:
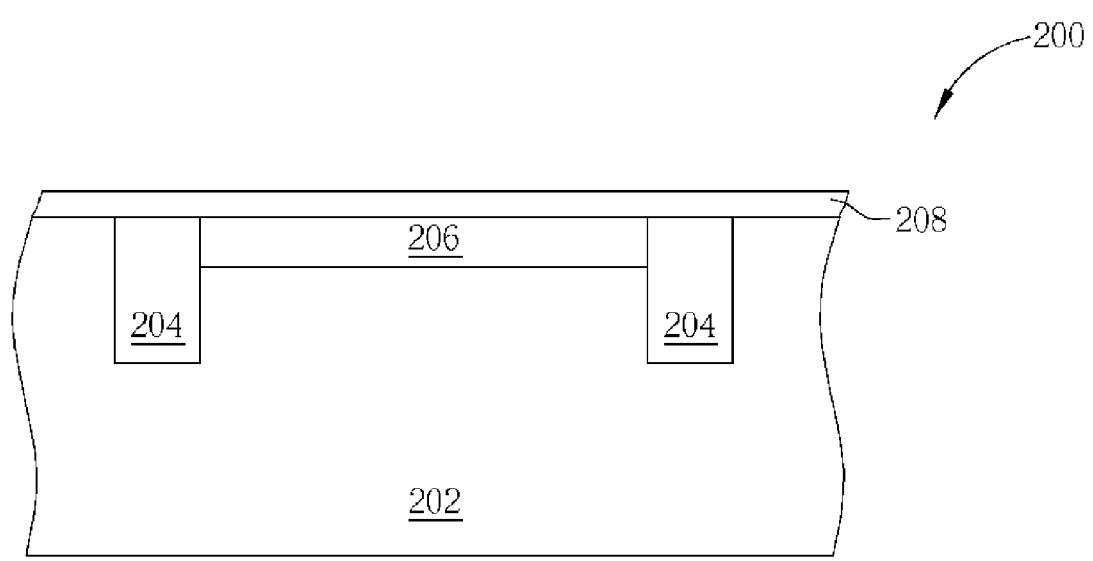
Figure 4:
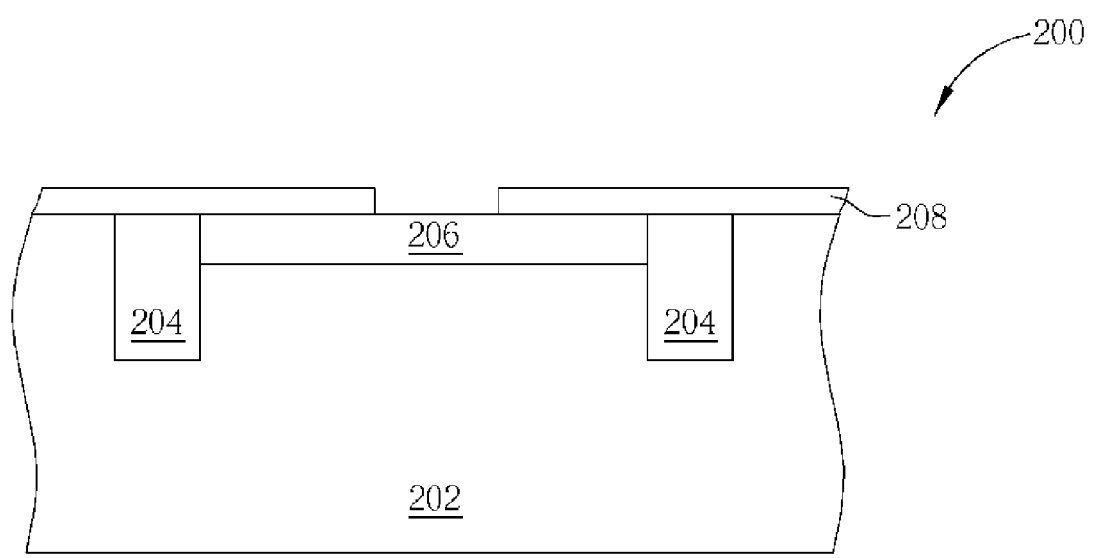
Figure 5:
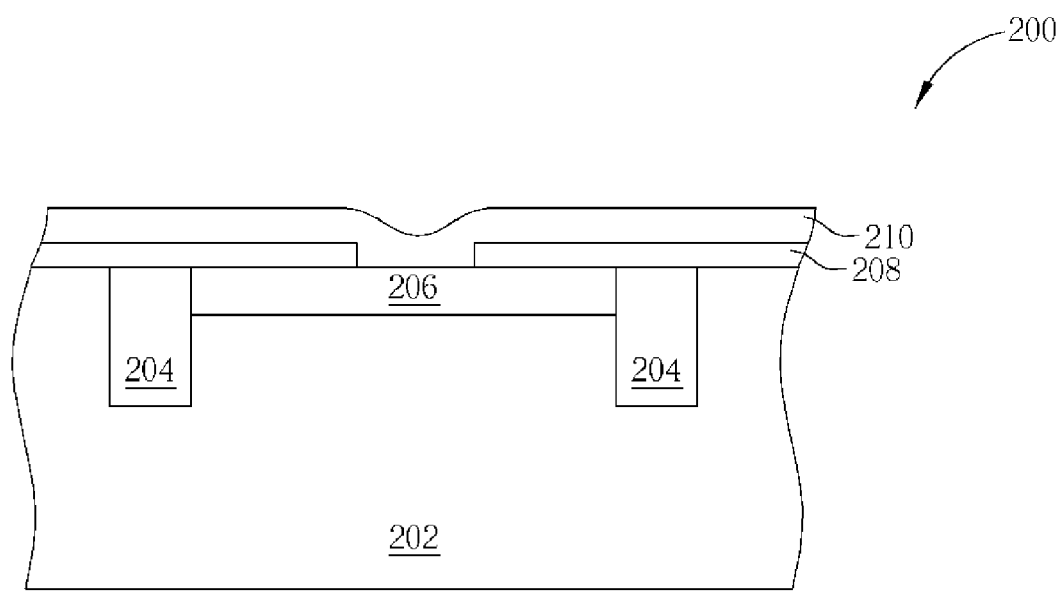
Figure 6:
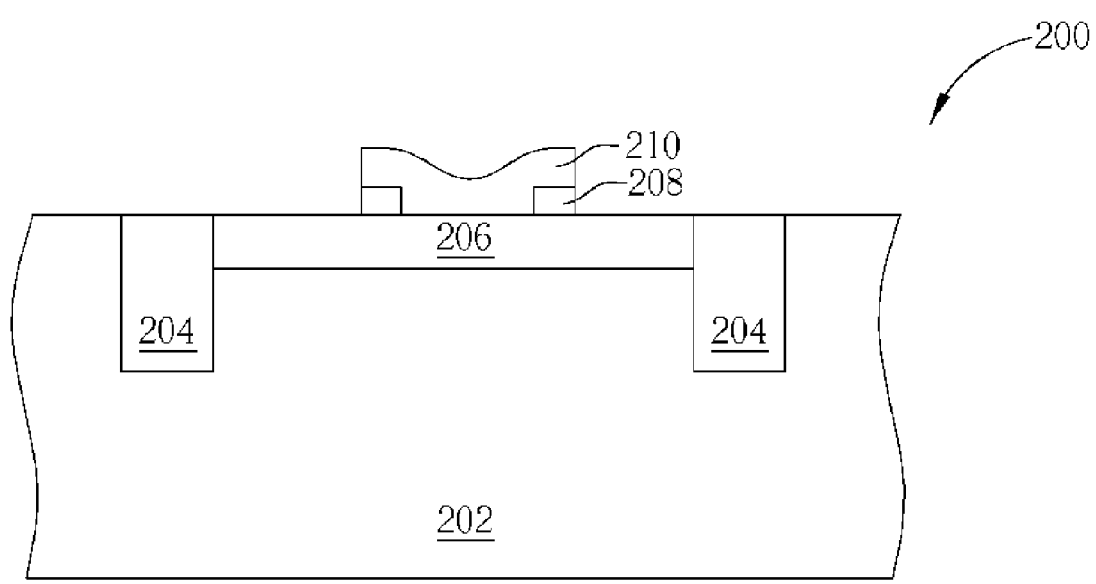

After forming the doping region 206, for isolating and protecting other devices on the semiconductor wafer 200 (such as the CMOS transistors), a protection layer 208 is formed on the semiconductor wafer 200 as shown in FIG. 3. The protection layer 208 includes silicon oxide and/or silicon nitride. Then, as shown in FIG. 4, a photo-etching process is performed to remove portions of the protection layer 208, and portions of the doping region 206 are exposed. Please refer to FIGS. 5 and 6. An epitaxy layer 210 of a second conductivity type is formed on the protection layer 208 and the exposed doping region 206, and another photo-etching process is performed to remove portions of the epitaxy layer 210 and portions of the protection layer 208. The pattern of the epitaxy layer 210 and the protection layer 208 defined in this step is a base electrode region. The epitaxy layer 210 can be replaced with another doping layer of the second conductivity type, such as amorphous silicon or polysilicon. In this preferred embodiment, the first conductivity type is N type, and the second conductivity type is P type. However, another situation where the first conductivity type is P type and the second conductivity type is N type can be also applied in the present invention.

Figure 7:
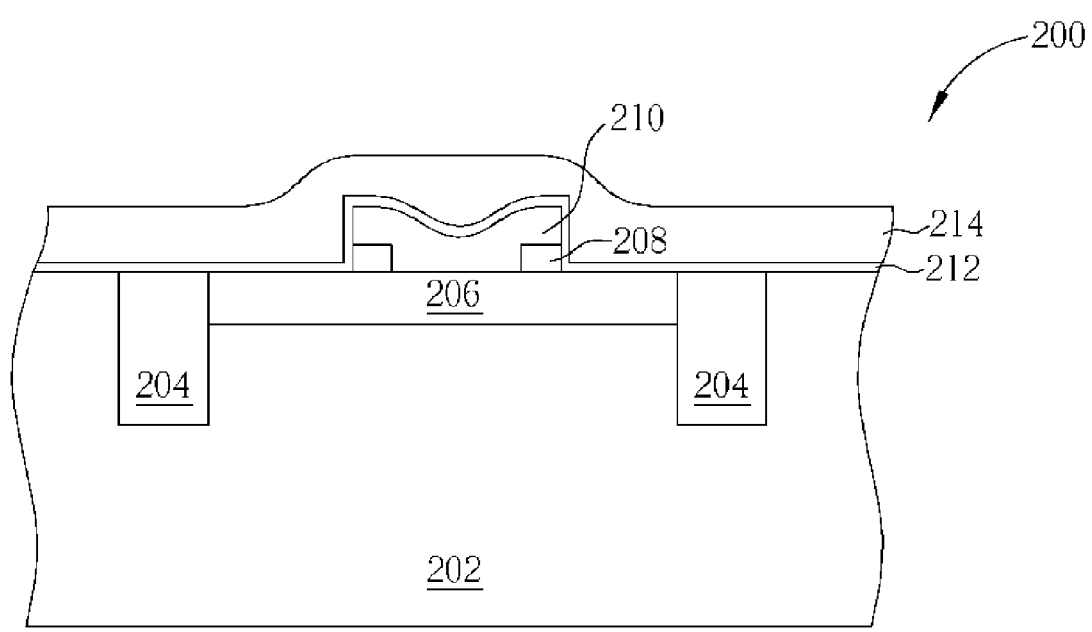
Figure 8:
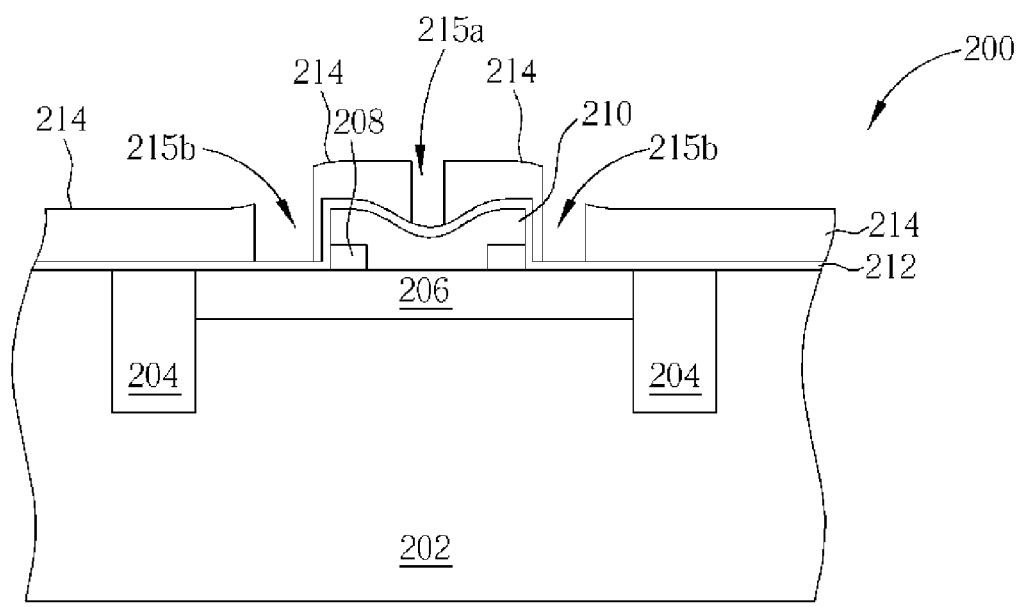

Next, as shown in FIG. 7, a silicon oxide layer 212 is formed on the semiconductor wafer 200, and an isolation layer 214 is formed on the silicon oxide layer 212. The silicon oxide layer 212 can be omitted in the present invention, but the silicon oxide layer 212 can form a native oxide layer in later steps to improve the gain of the BJT device. The isolation layer 214 includes silicon oxide and/or silicon nitride. A photo-etching process is performed to remove portions of the isolation layer 214 to form a collector electrode opening 215a located on the epitaxy layer 210 and two emitter electrode openings 215b located on the doping region 206 outside the epitaxy layer 210 as shown in FIG. 8. The step of forming the collector electrode opening 215a and the emitter electrode openings 215b removes portions of the isolation layer 214 and exposing the silicon oxide layer 212.

Figure 9:
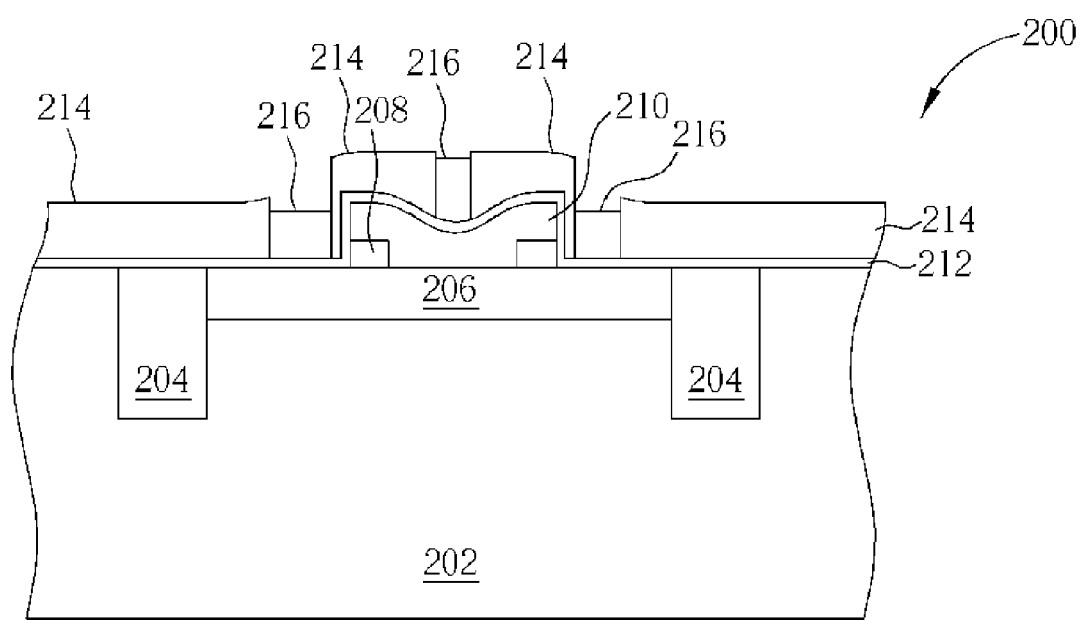
Figure 10:
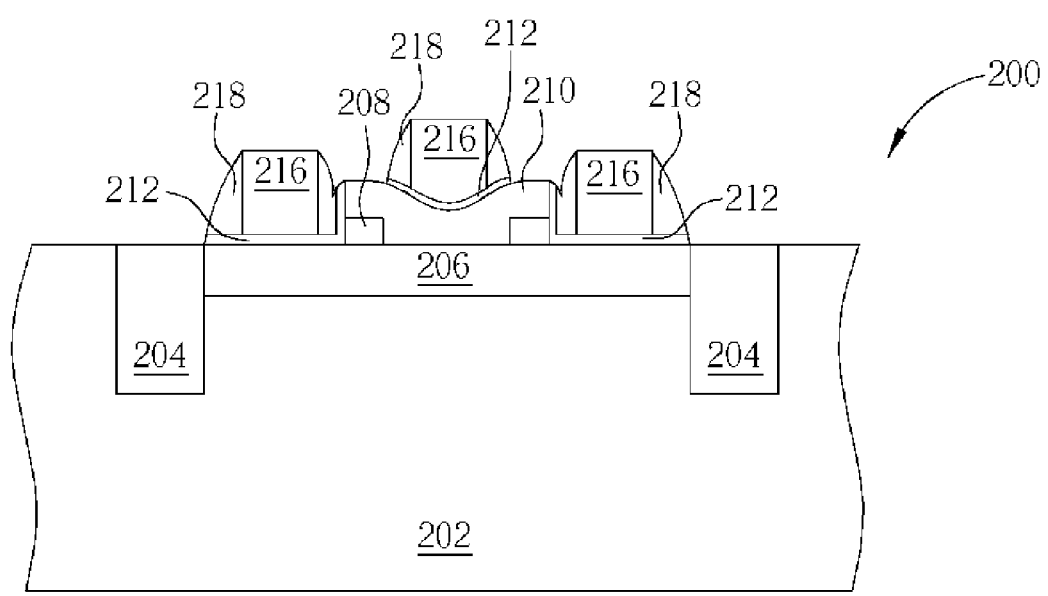
Figure 11:
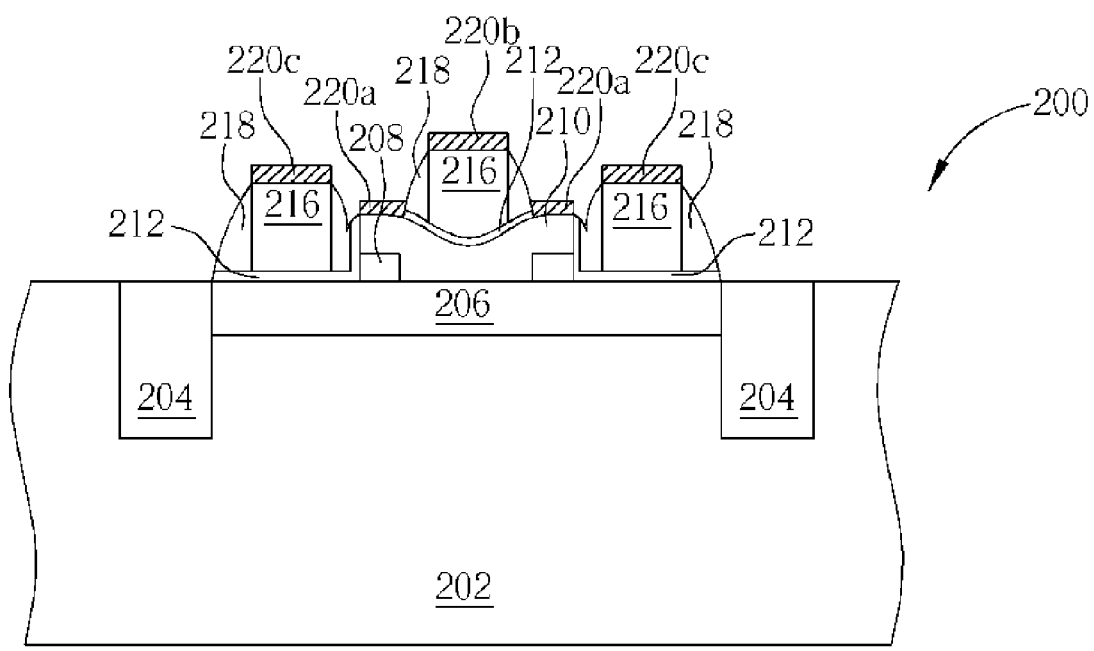

Please refer to FIG. 9. After forming the collector electrode opening 215a and the emitter electrode openings 215b, a polysilicon layer 216 is formed on the semiconductor wafer 200. Then an etch-back process or a chemical mechanical polishing process is performed to remove the redundant polysilicon layer 216. The polysilicon layer 216 in the collector electrode opening 215a and the emitter electrode openings 215b is retained. As FIG. 10 shows, a selective etching process is performed to remove the isolation layer 214 and the silicon oxide layer 212, and a spacer structure 218 is formed at a side wall of the polysilicon layer 216 and the epitaxy layer 210. As shown in FIG. 11, a self-aligned silicidation (salicide) process is performed to form a silicide layer 220a, 220b, and 220c on surfaces of the polysilicon layer 216 and the epitaxy layer 210 to be a contact region of the BJT. The spacer structure 218 is used for protecting the polysilicon layer 216 and portions of the epitaxy layer 210 from shorting when performing the salicide process. In this embodiment, the silicide layer 220a is a base contact region, the silicide layer 220b is a collector contact region, and the silicide layer 220c is an emitter contact region.

Figure 12:
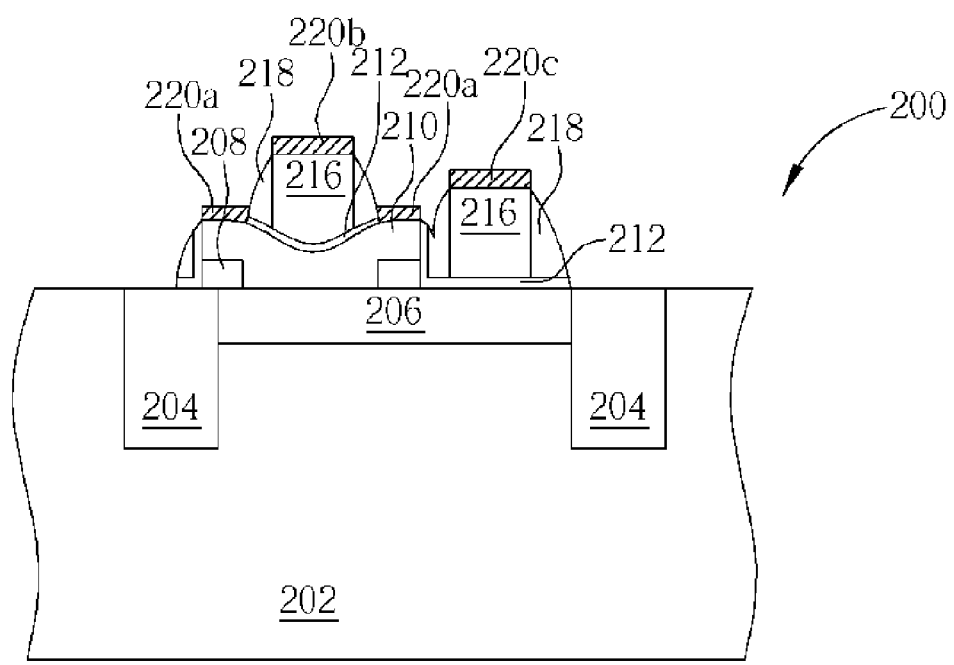
FIG. 12 is a cross-sectional diagram of another BJT according to the present invention.

In this embodiment, the polysilicon layer 216 is formed between the silicide layer 220c and the doping region 206, and the silicon oxide layer 212 is thinly formed on the doping region 206. When depositing the polysilicon layer 216, a very thin native oxide layer will be produced between the polysilicon layer 216 and the doping region 206 (between the polysilicon emitter 216 and the silicon substrate emitter 206). This step can improve the gain of the BJT device. In addition, the first embodiment is illustrated with two emitter contact regions 220c, however one emitter contact region 220c can be also used in the present invention. FIG. 12 shows a cross-sectional diagram of a BJT according to a second preferred embodiment. In FIG. 12, only one emitter contact region is used, and the manufacturing method is similar to that of the first embodiment.

In contrast to the prior art, the present invention can omit the steps of zero layer mark definition, buried layer implant/drive-in, substrate epitaxy deposition, and collector implant/drive-in, so that the manufacture procedure can be simplified. With the present invention, the manufacture cost of BiCMOS can be effectively reduced allowing industrial circles to popularly take advantage of the BiCMOS.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method for fabricating a bipolar junction transistor on a semiconductor wafer including a doping region of a first conductivity type and a plurality of isolated structures positioned on both ends of the doping region, the method comprising:

forming a protection layer on the semiconductor wafer, and removing portions of the protection layer to expose portions of the doping region;

forming a doping layer of a second conductivity type on the protection layer and the exposed doping region, and removing portions of the doping layer and portions of the protection layer to define a base electrode region;

depositing an isolation layer on the semiconductor wafer, and removing portions of the isolation layer to form at least a collector electrode opening and at least an emitter electrode opening;

forming a polysilicon layer in the collector electrode opening and the emitter electrode opening;

removing the isolation layer, and forming a spacer structure at a side wall of the polysilicon layer and the doping layer; and performing a self-aligned silicidation process to form a silicide layer on surfaces of the polysilicon layer and portions of the doping layer to be a contact region of the bipolar junction transistor.

2. The method of claim 1, wherein the isolated structures are formed by shallow trench isolation (STI).

3. The method of claim 1, wherein the isolated structures are formed by local oxidation of silicon (LOCOS).

4. The method of claim 1, wherein the protection layer includes silicon oxide and/or silicon nitride.

5. The method of claim 1, wherein after finishing defining the base electrode region, further comprising a step of forming a silicon oxide layer on surface of the semiconductor wafer.

6. The method of claim 5, wherein bottom of the collector electrode opening and the emitter electrode opening comprise the silicon oxide layer to be a native oxide layer.

7. The method of claim 1, wherein the isolation layer includes silicon oxide and/or silicon nitride.

8. The method of claim 1, wherein the doping layer includes epitaxy, amorphous silicon, or polysilicon.

9. The method of claim 1, wherein a native oxide layer is further formed under the polysilicon layer.

10. The method of claim 1, wherein the first conductivity type is P type and the second conductivity type is N type.

11. The method of claim 1, wherein the first conductivity type is N type and the second conductivity type is P type.

12. The method of claim 1 further comprising fabricating at least a complementary metal oxide semiconductor (CMOS) transistor, and a same implant process is performed to form the doping region and at least a source/drain electrode of the CMOS.

13. The method of claim 1, wherein the collector electrode opening is formed on the doping layer, and the emitter electrode opening is formed on the doping region outside the doping layer.

* * * * *